US011476053B2

(12) United States Patent
Nishikawa

(10) Patent No.: US 11,476,053 B2
(45) Date of Patent: Oct. 18, 2022

(54) MULTI-LAYER CERAMIC ELECTRONIC COMPONENT, METHOD OF PRODUCING A MULTI-LAYER CERAMIC ELECTRONIC COMPONENT, AND CIRCUIT BOARD

(71) Applicant: Taiyo Yuden Co., Ltd., Tokyo (JP)

(72) Inventor: Jun Nishikawa, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 17/179,037

(22) Filed: Feb. 18, 2021

(65) Prior Publication Data

US 2021/0280374 A1 Sep. 9, 2021

(30) Foreign Application Priority Data

Mar. 5, 2020 (JP) .............................. JP2020-037564

(51) Int. Cl.
*H01G 4/30* (2006.01)
*H01G 4/012* (2006.01)
*H01G 13/00* (2013.01)
*H05K 1/18* (2006.01)
*H01G 4/248* (2006.01)

(52) U.S. Cl.
CPC ............... *H01G 4/30* (2013.01); *H01G 4/012* (2013.01); *H01G 4/248* (2013.01); *H01G 13/00* (2013.01); *H05K 1/181* (2013.01); *H05K 2201/10015* (2013.01)

(58) Field of Classification Search
CPC ....................................................... H01G 4/30
USPC .......................................................... 174/260
See application file for complete search history.

(56) References Cited

U.S. PATENT DOCUMENTS

| 10,403,437 | B2* | 9/2019 | Kowase | ................. | H01G 4/005 |
| 2016/0351332 | A1* | 12/2016 | Lee | ........................... | H01G 4/30 |
| 2017/0250027 | A1* | 8/2017 | Kowase | ................. | H01G 4/248 |
| 2018/0332715 | A1* | 11/2018 | Woo | ................... | H01L 23/49833 |
| 2019/0318874 | A1* | 10/2019 | Orimo | ................... | H05K 3/3442 |
| 2020/0234883 | A1* | 7/2020 | Muramatsu | ......... | H01G 4/1236 |
| 2020/0402714 | A1* | 12/2020 | Yoon | ........................ | H01G 2/22 |

FOREIGN PATENT DOCUMENTS

| JP | 2000-49032 A | 2/2000 |
| JP | WO 2017/090530 | * 11/2015 |
| WO | WO 2017/090530 | * 11/2016 |

* cited by examiner

*Primary Examiner* — Stanley Tso
(74) *Attorney, Agent, or Firm* — Stein IP, LLC

(57) ABSTRACT

A multi-layer ceramic electronic component includes: a ceramic body including a first end surface and a second end surface facing in a direction of a first axis, and internal electrodes laminated in a direction of a second axis orthogonal to the first axis and drawn from the first end surface or the second end surface; a first external electrode disposed to cover the first end surface; and a second external electrode disposed to cover the second end surface. Each of the first external electrode and the second external electrode has an electrode end surface facing in the direction of the first axis. The electrode end surface includes a pair of first peripheral regions located at peripheral edges in the direction of the second axis, and a first concave region located between the pair of first peripheral regions and recessed from the pair of first peripheral regions.

10 Claims, 7 Drawing Sheets

MULTI-LAYER CERAMIC ELECTRONIC COMPONENT, METHOD OF PRODUCING A MULTI-LAYER CERAMIC ELECTRONIC COMPONENT, AND CIRCUIT BOARD

CROSS-REFERENCE TO RELATED APPLICATIONS

This application claims the benefit of Japanese Application No. 2020-037564, filed Mar. 5, 2020, in the Japanese Patent Office. All disclosures of the document named above are incorporated herein by reference.

BACKGROUND ART

The present disclosure relates to a multi-layer ceramic electronic component, a method of producing the same, and a circuit board including a multi-layer ceramic electronic component.

A multi-layer ceramic electronic component such as a multi-layer ceramic capacitor includes a ceramic body including a plurality of internal electrodes laminated, and a pair of external electrodes that cover the ends of the ceramic body. In the multi-layer ceramic electronic component, typically, the external electrodes are connected to lands of a circuit board by soldering or the like.

For example, when the pair of external electrodes are soldered to the circuit board by a reflow method, as described in paragraph 0008 and FIG. 3 of Japanese Patent Application Laid-open No. 2000-49032, a so-called Manhattan phenomenon (Tombstone phenomenon) in which the multi-layer ceramic capacitor rises due to the surface tension of the pair of solders occurs in some cases.

From the viewpoint of preventing the above phenomenon, the multi-layer capacitor described in Japanese Patent Application Laid-open No. 2000-49032 includes a ceramic sintered body (ceramic body) whose end surfaces are concave surfaces, and external electrodes each having a flat outer surface and covering the end surface.

SUMMARY OF THE INVENTION

Along with the miniaturization of electronic devices in recent years, multi-layer ceramic electronic components have been lightweight, and the Manhattan phenomenon (Tombstone phenomenon) has been more likely to occur. In this regard, the configuration of Japanese Patent Application Laid-open No. 2000-49032 has sometimes difficulty in sufficiently preventing the Manhattan phenomenon. Additionally, when the concave surface of the ceramic sintered body (ceramic body) is deepened to prevent the Manhattan phenomenon, the peripheral edge of the end surface protrudes, resulting in occurrence of a structural defect such as cracks in some cases.

In view of the circumstances as described above, it is desirable to provide a multi-layer ceramic electronic component, a method of producing the same, and a circuit board including a multi-layer ceramic electronic component, which are capable of preventing the Manhattan phenomenon while preventing a structural defect of a ceramic body.

Additional or separate features and advantages of the disclosure will be set forth in the descriptions that follow and in part will be apparent from the description, or may be learned by practice of the disclosure. The objectives and other advantages of the disclosure will be realized and attained by the structure particularly pointed out in the written description and claims thereof as well as the appended drawings.

To achieve these and other advantages and in accordance with the purpose of the present disclosure, as embodied and broadly described, in one embodiment, the present disclosure provides a multi-layer ceramic electronic component including a ceramic body, a first external electrode, and a second external electrode.

The ceramic body includes a first end surface and a second end surface facing in a direction of a first axis, and internal electrodes laminated in a direction of a second axis orthogonal to the first axis and drawn from the first end surface or the second end surface.

The first external electrode is disposed to cover the first end surface.

The second external electrode is disposed to cover the second end surface.

Each of the first external electrode and the second external electrode has an electrode end surface facing in the direction of the first axis.

The electrode end surface includes a pair of first peripheral regions located at peripheral edges in the direction of the second axis, and a first concave region located between the pair of first peripheral regions and recessed from the pair of first peripheral regions.

In a cross-section obtained by bisecting the multi-layer ceramic electronic component in a direction of a third axis orthogonal to the first axis and the second axis, b/a is 0.004 or more and 0.025 or less, where a is a length of an imaginary line segment connecting boundaries between each of the pair of first peripheral regions and the first concave region, and b is a length of a longest perpendicular line in the direction of the first axis among perpendicular lines extending from the line segment to the first concave region.

In this configuration, the electrode end surface includes the first concave region satisfying the conditions for b/a. When b/a satisfies the condition of 0.004 or more, the first concave region is sufficiently recessed. At the time of mounting on a board by a solder, the solder is likely to accumulate in the first concave region. Therefore, floating of the external electrode from the board is prevented by the accumulated molten solder, which makes it possible to prevent the Manhattan phenomenon. When b/a satisfies the condition of 0.025 or less, the shape of the first concave region can be made moderately gentle concave, and the peripheral edges of the first end surface and the second end surface of the ceramic body can be prevented from having a protruding shape. Therefore, it is possible to prevent a structural defect such as cracks in the ceramic body. As described above, according to this configuration, it is possible to obtain a multi-layer ceramic electronic component capable of preventing the Manhattan phenomenon while preventing a structural defect.

Each of the first end surface and the second end surface of the ceramic body may include a pair of second peripheral regions located at peripheral edges in the direction of the second axis, and a second concave region located between the pair of second peripheral regions and recessed from the pair of second peripheral regions inwardly in the direction of the first axis.

The pair of first peripheral regions may cover the pair of second peripheral regions.

The first concave region may cover the second concave region.

This makes it possible to prevent the thickness of the first external electrode and the second external electrode in the first concave region from being reduced and to reliably cover the first end surface and the second end surface with the first external electrode and the second external electrode, respectively. Further, when b/a satisfies the condition of 0.025 or less, the shape of the boundary portion between the second concave region and the second peripheral region can be made gentle, and a structural defect such as cracks in the vicinity of the boundary portion can be prevented.

The ceramic body may include a multi-layer unit including the internal electrodes and ceramic layers alternately laminated, and a pair of covers disposed outside the multi-layer unit in the direction of the second axis.

For example, the pair of second peripheral regions may be disposed on surfaces of the pair of covers in the direction of the first axis.

For example, the ceramic body may be configured such that a dimension in the direction of the second axis is larger than a dimension in the direction of the third axis.

In such a ceramic body, the balance is easily lost particularly at the time of mounting, and the Manhattan phenomenon easily occurs. Providing the first concave region to the electrode end surface of the multi-layer ceramic capacitor including such a ceramic body makes it possible to effectively prevent the Manhattan phenomenon.

For example, the multi-layer ceramic electronic component may have a dimension in the direction of the first axis and in the direction of the third axis of 0.2 mm or more and 2.0 mm or less.

Additionally, the multi-layer ceramic electronic component may have a dimension in the direction of the second axis of 300 µm or less.

For example, the pair of second peripheral regions may have a width in the direction of the second axis of 4 µm or more and 70 µm or less, 6 µm or more and 55 µm or less, or 11 µm or more and 35 µm or less.

In another embodiment, the present disclosure provides a method of producing a multi-layer ceramic electronic component, the method including: producing a ceramic body including a first end surface and a second end surface facing in a direction of a first axis, and internal electrodes laminated in a direction of a second axis orthogonal to the first axis and drawn from the first end surface or the second end surface; and forming a first external electrode disposed to cover the first end surface, and a second external electrode disposed to cover the second end surface.

Each of the first external electrode and the second external electrode has an electrode end surface facing in the direction of the first axis.

The electrode end surface includes a pair of first peripheral regions located at peripheral edges in the direction of the second axis, and a first concave region located between the pair of first peripheral regions and recessed from the pair of first peripheral regions.

In a cross-section obtained by bisecting the multi-layer ceramic electronic component in a direction of a third axis orthogonal to the first axis and the second axis, b/a is 0.004 or more and 0.025 or less, where a is a length of an imaginary line segment connecting boundaries between each of the pair of first peripheral regions and the first concave region, and b is a length of a longest perpendicular line in the direction of the first axis among perpendicular lines extending from the line segment to the first concave region.

For example, the producing the ceramic body may include preparing first ceramic sheets having a first density and second ceramic sheets having a second density larger than the first density, the first ceramic sheets and the second ceramic sheets including unsintered internal electrodes, laminating the second ceramic sheets outside a laminate in the direction of the second axis, the laminate including the first ceramic sheets laminated in the direction of the second axis, and sintering a laminate including the first ceramic sheets and the second ceramic sheets.

An expression of $0.050 \leq (d-c)/d \leq 0.150$ may be satisfied, where c is the first density and d is the second density.

When $0.050 \leq (d-c)/d$ is satisfied, the first ceramic sheets having the first density can shrink more than the second ceramic sheets having the second density at the time of sintering the ceramic body. This makes it possible to form the first concave region of the ceramic body in which b/a is 0.004 or more. Therefore, as described above, the Manhattan phenomenon can be prevented by the first concave region.

When $(d-c)/d \leq 0.150$ is satisfied, the shrinkage amount of the first ceramic sheets can be moderately suppressed at the time of sintering the ceramic body. This makes it possible to form the first concave region in which b/a is 0.025 or less, and to prevent cracks of the ceramic body as described above. Further, when $(d-c)/d \leq 0.150$ is satisfied, delamination in the vicinity of the boundary between the multi-layer unit formed by the laminate of the first ceramic sheets and the cover formed by the laminate of the second ceramic sheets can be prevented. Therefore, a structural defect of the ceramic body can be effectively prevented.

In still another embodiment, the present disclosure provides a circuit board including a mounting board, a multi-layer ceramic electronic component, a first solder, and a second solder.

The multi-layer ceramic electronic component includes a ceramic body, a first external electrode, and a second external electrode.

The ceramic body includes a first end surface and a second end surface facing in a direction of a first axis, a first main surface and a second main surface facing in a direction of a second axis orthogonal to the first axis, and internal electrodes laminated in the direction of the second axis and drawn from the first end surface or the second end surface.

The first external electrode is disposed to cover the first end surface.

The second external electrode is disposed to cover the second end surface.

The multi-layer ceramic electronic component is disposed such that the first main surface or the second main surface faces the mounting board.

The first solder connects the first external electrode and the mounting board to each other.

The second solder connects the second external electrode and the mounting board to each other.

Each of the first external electrode and the second external electrode has an electrode end surface facing in the direction of the first axis.

The electrode end surface includes a pair of first peripheral regions located at peripheral edges in the direction of the second axis, and a first concave region located between the pair of first peripheral regions and recessed from the pair of first peripheral regions.

In a cross-section obtained by bisecting the multi-layer ceramic electronic component in a direction of a third axis orthogonal to the first axis and the second axis, b/a is 0.004 or more and 0.025 or less, where a is a length of an imaginary line segment connecting boundaries between each of the pair of first peripheral regions and the first concave region, and b is a length of a longest perpendicular line in the direction of the first axis among perpendicular lines extending from the line segment to the first concave region.

As described above, according to the present disclosure, it is possible to provide a multi-layer ceramic electronic component, a method of producing the same, and a circuit board including a multi-layer ceramic electronic component, which are capable of preventing the Manhattan phenomenon while preventing a structural defect of a ceramic body.

These and other objects, features and advantages of the present disclosure will become more apparent in light of the following detailed description of embodiments thereof, as illustrated in the accompanying drawings.

It is to be understood that both the foregoing general description and the following detailed description are exemplary and explanatory, and are intended to provide further explanation of the disclosure as claimed.

DETAILED DESCRIPTION OF THE EMBODIMENTS

Hereinafter, an embodiment of the present disclosure will be described with reference to the drawings.

In the figures, an X axis, a Y axis, and a Z axis orthogonal to one another are shown as appropriate. The X axis, the Y axis, and the Z axis are common in all figures.

1. OVERALL CONFIGURATION OF MULTI-LAYER CERAMIC CAPACITOR

Figure 1:
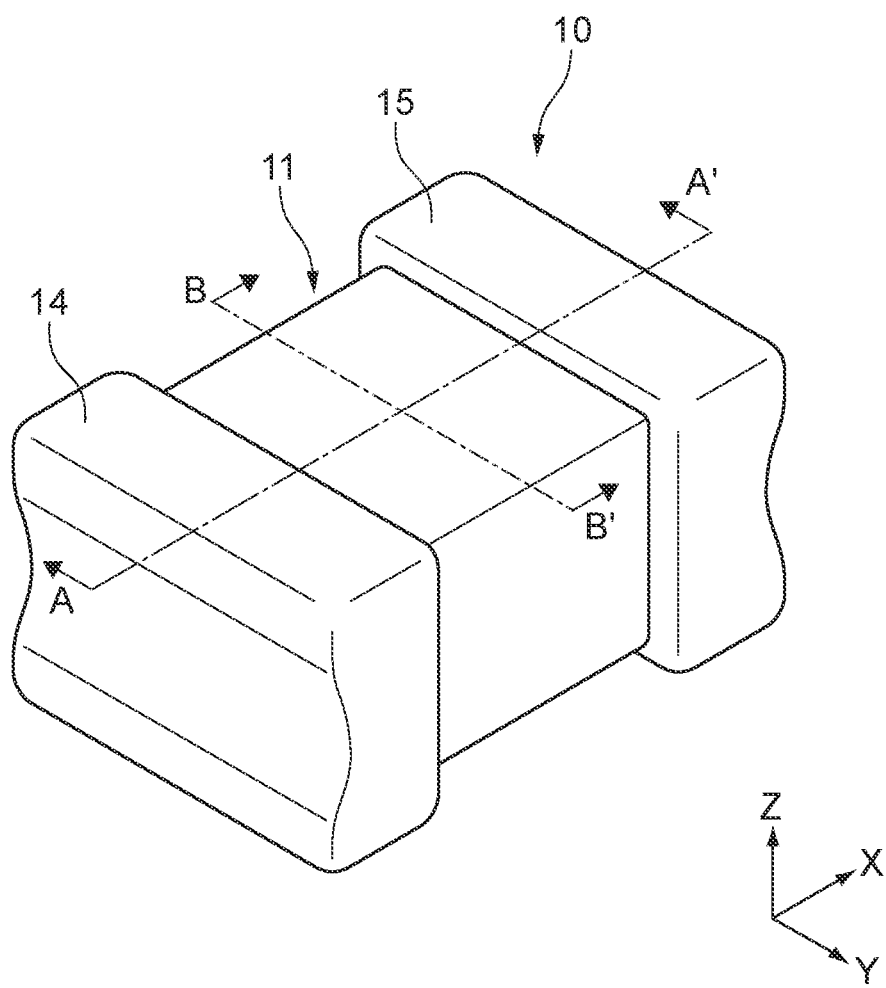
FIG. 1 is a perspective view of a multi-layer ceramic capacitor according to an embodiment of the present disclosure.
Figure 2:
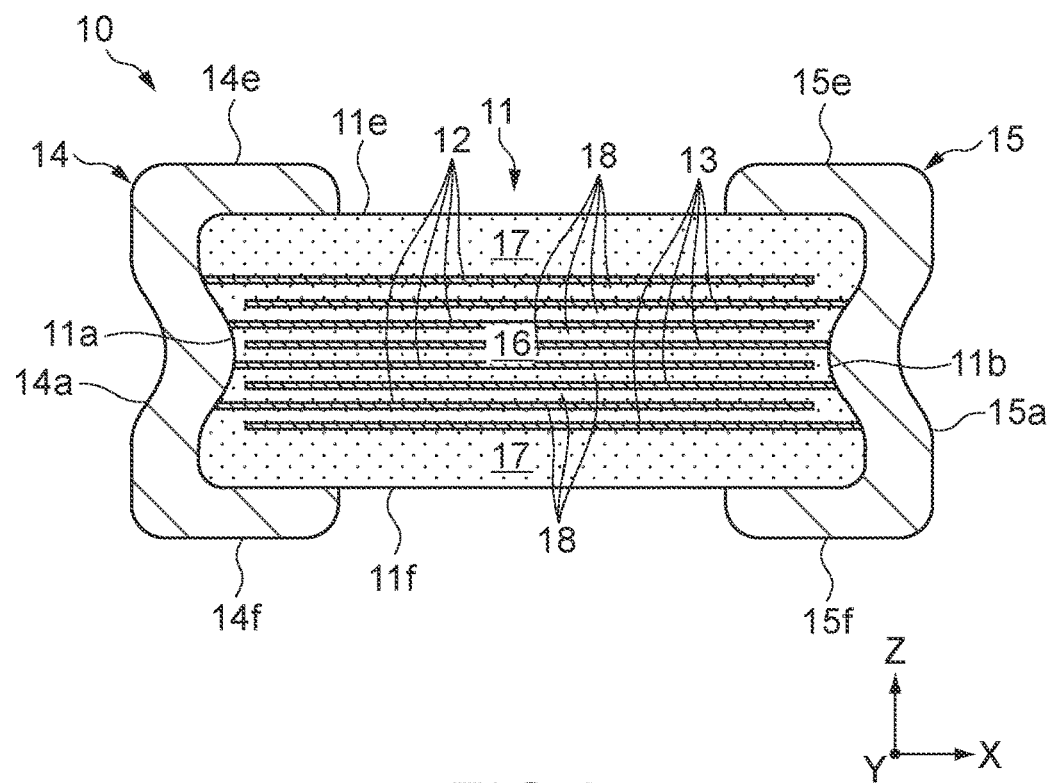
FIG. 2 is a cross-sectional view of the multi-layer ceramic capacitor taken along the A-A' line in FIG. 1.
Figure 3:
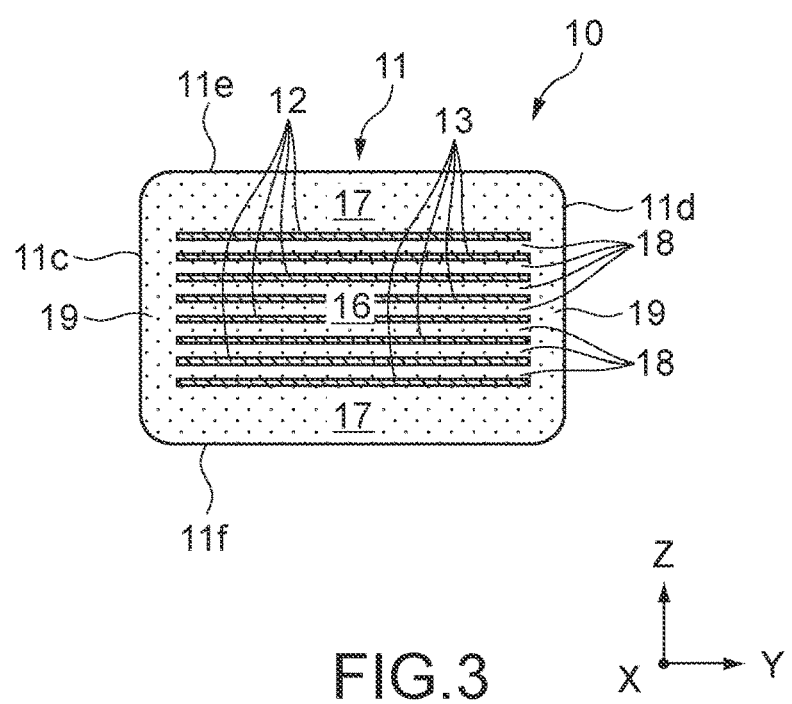
FIG. 3 is a cross-sectional view of the multi-layer ceramic capacitor taken along the B-B' line in FIG. 1.

FIGS. 1 to 3 each show a multi-layer ceramic capacitor 10 according to an embodiment of the present disclosure. FIG. 1 is a perspective view of the multi-layer ceramic capacitor 10. FIG. 2 is a cross-sectional view of the multi-layer ceramic capacitor 10 taken along the A-A' line in FIG. 1. FIG. 3 is a cross-sectional view of the multi-layer ceramic capacitor 10 taken along the B-B' line in FIG. 1.

The multi-layer ceramic capacitor 10 includes a ceramic body 11, a first external electrode 14, a second external electrode 15. Each of the first external electrode 14 and the second external electrode 15 is formed on the surface of the ceramic body 11.

The ceramic body 11 has a substantially rectangular parallelepiped shape. In other words, the ceramic body 11 has a first end surface 11a and a second end surface 11b facing in the X-axis direction, a first side surface 11c and a second side surface 11d facing in the Y-axis direction, and a first main surface 11e and a second main surface 11f facing in the Z-axis direction. The first and second end surfaces 11a and 11b extend along the Y- and Z-axis directions. The first and second side surfaces 11c and 11d extend along the Z- and X-axis directions. The first and second main surfaces 11e and 11f extend along the X- and Y-axis directions.

The first and second side surfaces 11c and 11d and the first and second main surfaces 11e and 11f of the ceramic body 11 are each configured as a flat surface. The flat surface according to this embodiment does not need to be strictly flat if the surface may be recognized as being flat when viewed as a whole. For example, the flat surface according to this embodiment also includes a surface having fine irregularities thereon, a surface having a gently curved shape in a predetermined range, and the like. For example, ridges that connect the surfaces of the ceramic body 11 may be chamfered. Note that each of the first and second end surfaces 11a and 11b partially has a concave shape as will be described later.

For the size of the multi-layer ceramic capacitor 10, for example, a dimension in the X-axis direction is 0.2 mm or more and 2.0 mm or less, and a dimension in the Y-axis direction is 0.2 mm and more to 2.0 mm or less. The multi-layer ceramic capacitor 10 may have a longitudinal direction in either one of the X-axis direction and the Y-axis direction, and in the example shown in FIGS. 1 to 3, a longitudinal direction in the X-axis direction. A dimension of the multi-layer ceramic capacitor 10 in the Z-axis direction is, for example, 300 μm or less, and the multi-layer ceramic capacitor 10 is configured to be reduced in height. Note that each dimension of the multi-layer ceramic capacitor 10 is assumed as a dimension of a largest portion along each direction.

The ceramic body 11 includes a multi-layer unit 16 and a pair of covers 17. In the multi-layer unit 16, a plurality of first and second internal electrodes 12 and 13 and a plurality of ceramic layers 18 are alternately laminated. The pair of covers 17 are disposed outside the multi-layer unit 16 in the Z-axis direction. The covers 17 protect the vicinity of the first and second main surface 11e and 11f of the ceramic body 11 and ensure the insulation properties of the first and second internal electrodes 12 and 13.

The multi-layer unit 16 includes the plurality of first internal electrodes 12 and the plurality of second internal electrodes 13, which are laminated in the order of the first internal electrode 12, the ceramic layer 18, the second internal electrode 13, and the ceramic layer 18, for example. The first internal electrodes 12 are drawn to the first end surface 11a and spaced apart from the second end surface 11b. The second internal electrodes 13 are drawn to the second end surface 11b and spaced apart from the first end surface 11a. The number of layers of the first and second internal electrodes 12 and 13 is not limited to the illustrated example.

Examples of a good conductor of electricity forming the first and second internal electrodes 12 and 13 typically include nickel (Ni), and other than nickel (Ni), include a metal containing as a main component copper (Cu), palladium (Pd), platinum (Pt), silver (Ag), gold (Au), or the like, and an alloy of those metals. Note that the main component is assumed as a component occupying 50% or more in the composition ratio.

The ceramic layers 18 are formed of dielectric ceramics. In order to increase the capacitance of the multi-layer unit 16, the ceramic layers 18 are formed of dielectric ceramics having a high dielectric constant. Examples of the dielectric ceramics having a high dielectric constant to be used include a polycrystal including a barium titanate ($BaTiO_3$) based material, i.e., a polycrystal having a Perovskite structure containing barium (Ba) and titanium (Ti). Thus, the multi-layer ceramic capacitor 10 having a large capacity is obtained.

Note that the ceramic layers 18 may be formed of a strontium titanate ($SrTiO_3$) based material, a calcium titanate ($CaTiO_3$) based material, a magnesium titanate ($MgTiO_3$) based material, a calcium zirconate ($CaZrO_3$) based material, a calcium zirconate titanate ($Ca(Zr,Ti)O_3$) based material, a barium zirconate ($BaZrO_3$) based material, a titanium oxide ($TiO_2$) based material, or the like.

The multi-layer unit 16 includes side margins 19 located at the peripheral edges in the Y-axis direction and including no internal electrodes 12 and 13 (see FIG. 3). The side margins 19 are capable of protecting the vicinity of the first and second side surfaces 11c and 11d of the ceramic body 11 and ensuring the insulation properties of the first and second internal electrodes 12 and 13.

The covers 17 and the side margins 19 are formed of dielectric ceramics. The material forming the covers 17 and the side margins 19 only needs to be insulating ceramics, but if dielectric ceramics similar to that of the ceramic layers 18 is used therefor, the internal stress in the ceramic body 11 is reduced.

The first external electrode 14 is disposed to cover the first end surface 11a. In the example shown in FIGS. 1 and 2, the first external electrode 14 covers the first end surface 11a and extends to the first main surface 11e and the second main surface 11f and to the first side surface 11c and the second side surface 11d. The first external electrode 14 is connected to the first internal electrodes 12 drawn to the first end surface 11a.

The second external electrode 15 is disposed to cover the second end surface 11b. In the example shown in FIGS. 1 and 2, the second external electrode 15 covers the second end surface 11b and extends to the first main surface 11e and the second main surface 11f and to the first side surface 11c and the second side surface 11d. The second external electrode 15 is connected to the second internal electrode 13 drawn to the second end surface 11b.

2. DETAILED CONFIGURATION OF CERAMIC BODY

Figure 4:
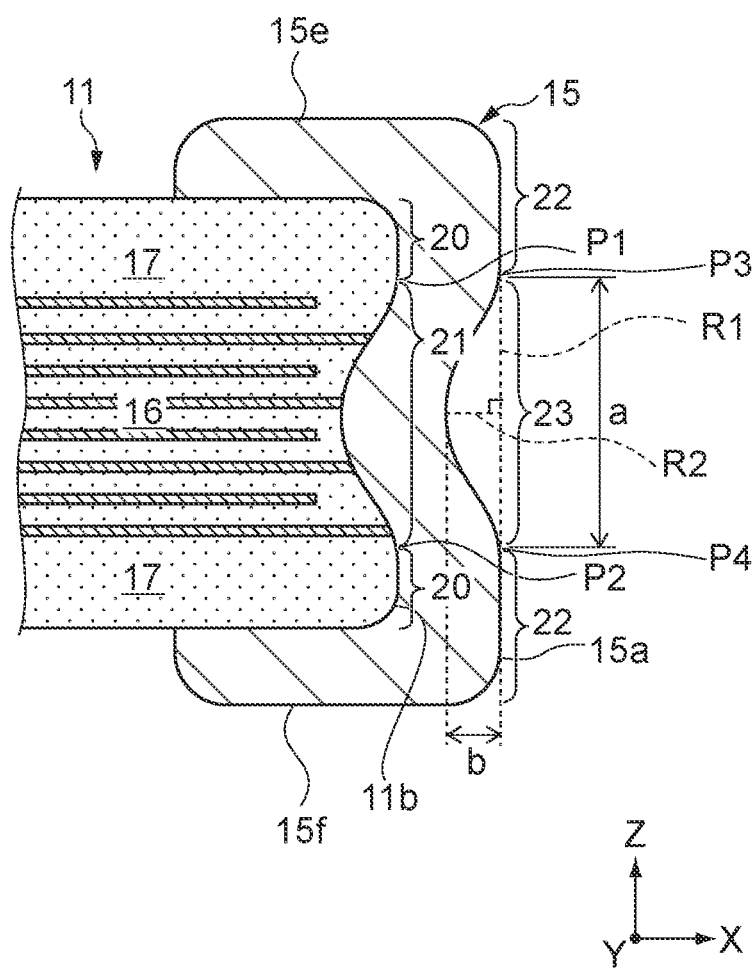
FIG. 4 is an enlarged view of a part of FIG. 2.

FIG. 4 is an enlarged view of a part of FIG. 2. In this embodiment, the first end surface 11a and the second end surface 11b are configured to be substantially plane-symmetrical with respect to a plane orthogonal to the X-axis direction, and thus the illustration of the first end surface 11a side will be omitted in FIG. 4.

For example, each of the first end surface 11a and the second end surface 11b includes a pair of second peripheral regions 20 and a second concave region 21.

The pair of second peripheral regions 20 are located at the peripheral edges of the first end surface 11a or the second end surface 11b in the Z-axis direction. The second peripheral region 20 has a width in the Z-axis direction and is formed in a band shape extending along the Y-axis direction in this embodiment. "The width of the second peripheral region 20 in the Z-axis direction" means a distance in the Z-axis direction from the first main surface 11e to a boundary P1 or from the second main surface 11f to a boundary P2, which will be described later. The width is, for example, 4 μm or more and 70 μm or less, favorably 6 μm or more and 55 μm or less, more favorably 11 μm or more and 35 μm or less.

The second concave region 21 is located between the pair of second peripheral regions 20 and recessed inwardly in the X-axis direction from the pair of second peripheral regions 20. The boundary P1 or P2 between the second concave region 21 and the second peripheral region 20 is defined as a point where the inward recess in the X-axis direction starts from the second peripheral region 20, in the cross-section parallel to the Z-X plane of the multi-layer ceramic capacitor 10. The boundary P1 or P2 extends in the Y-axis direction. In other words, the second concave region 21 is formed of a concave surface extending in the Y-axis direction.

The second concave region 21 is formed of a curved surface recessed inwardly in the X-axis direction as a whole in the example shown in FIG. 4, but it may have fine irregularities on the surface. The most inward portion in the X-axis direction of the second concave region 21 may be located at the central portion of the second concave region 21 in the Z-axis direction or may be biased from the central portion in the Z-axis direction.

In the example shown in FIGS. 2 and 4, the second peripheral region 20 includes a substantially flat surface orthogonal to the X-axis direction, but it is not limited thereto. For example, the second peripheral region 20 may include an inclined surface protruding outwardly in the X-axis direction from the peripheral edge of the first end surface 11a or the second end surface 11b in the Z-axis direction. In this case, the inclined surface may be a substantially flat surface or a curved surface. If the second peripheral region 20 includes such an inclined surface, the boundary between the second peripheral region 20 and the second concave region 21 is the top of the inclined surface located most outwardly in the X-axis direction.

For example, the pair of second peripheral regions 20 are disposed on the surfaces of the pair of covers 17 in the X-axis direction. The second peripheral region 20 may be disposed on at least a part of the surface of the cover 17.

In this embodiment, the first end surface 11a and the second end surface 11b have the configuration described above, and thus the concave regions are also formed on the first and second external electrodes 14 and 15.

3. DETAILED CONFIGURATION OF EXTERNAL ELECTRODE

As shown in FIG. 2, the first external electrode 14 has an electrode end surface 14a facing in the X-axis direction, a first electrode main surface 14e and a second electrode main surface 14f facing in the Z-axis direction, and a first electrode side surface and a second electrode side surface facing in the Y-axis direction (not shown). Similarly, the second external electrode 15 has an electrode end surface 15a facing in the X-axis direction, a first electrode main surface 15e and a second electrode main surface 15f facing in the Z-axis direction, and a first electrode side surface and a second electrode side surface facing in the Y-axis direction (not shown).

Each of the electrode end surfaces 14a and 15a includes a pair of first peripheral regions 22 and a first concave region 23. In this embodiment, the first and second external electrodes 14 and 15 are configured to be substantially plane-symmetrical with respect to a plane orthogonal to the X-axis direction, and thus the illustration of the first external electrode 14 will be omitted in FIG. 4.

The pair of first peripheral regions 22 are located at the peripheral edges of the first electrode end surface 14a or the second electrode end surface 15a in the Z-axis direction and cover the pair of second peripheral regions 20. The first peripheral region 22 has a width in the Z-axis direction and is formed in a band shape extending along the Y-axis direction in this embodiment. "The width of the first peripheral region 22 in the Z-axis direction" means a distance in the Z-axis direction from the first electrode main surface 14$e$ or 15$e$ to a boundary P3 or from the second electrode main surface 14$f$ or 15$f$ to a boundary P4, which will be described later.

The first concave region 23 is located between the pair of first peripheral regions 22 and covers the second concave region 21. The first concave region 23 covers the second concave region 21 and is recessed from the first peripheral regions 22. The first concave region 23 is recessed in a shape along the second concave region 21.

The boundary P3 or P4 between the first concave region 23 and the first peripheral region 22 is defined as a point where the inward recess in the X-axis direction starts from the first peripheral region 22, in the cross-section parallel to the Z-X plane of the multi-layer ceramic capacitor 10. The boundary P3 or P4 extends in the Y-axis direction. In other words, the first concave region 23 is formed of a concave surface extending in the Y-axis direction.

The first concave region 23 is formed of a curved surface recessed inwardly in the X-axis direction as a whole in the example shown in FIG. 4, but it may have fine irregularities on the surface.

The most inward portion in the X-axis direction of the first concave region 23 may be located at the central portion of the first concave region 23 in the Z-axis direction or may be biased from the central portion in the Z-axis direction.

In the example shown in FIG. 4, the first peripheral region 22 includes a substantially flat surface orthogonal to the X-axis direction, but it is not limited thereto similarly to the second peripheral region 20. For example, the first peripheral region 22 may include an inclined surface protruding outwardly in the X-axis direction from the peripheral edge of the first end surface 11$a$ or the second end surface 11$b$ in the Z-axis direction. In this case, the inclined surface may be a substantially flat surface or a curved surface. If the first peripheral region 22 includes such an inclined surface, the boundary P3 or P4 is the top of the inclined surface located most outwardly in the X-axis direction.

Specifically, the first concave region 23 is recessed in the following shape. It is assumed that, in the cross-section obtained by bisecting the multi-layer ceramic capacitor 10 in the Y-axis direction, an imaginary line segment R1 having a length a connects the boundaries P3 and P4 between each first peripheral region 22 and the first concave region 23. The cross-section is parallel to the Z-X plane. Among perpendicular lines extending from the line segment R1 to the first concave region 23, the length of a perpendicular line R2, which is the longest in the X-axis direction, is assumed as b. In this case, b/a is 0.004 or more and 0.025 or less. Note that, in FIG. 4 and the like, the first concave region 23 is expressed as being recessed to be larger than the actual one for the sake of explanation.

Since the first concave region 23 is thus recessed, although details will be described later, it is possible to prevent the Manhattan phenomenon at the time of mounting on a board and to prevent a structural defect of the ceramic body 11.

4. CONFIGURATION OF CIRCUIT BOARD

Figure 5:
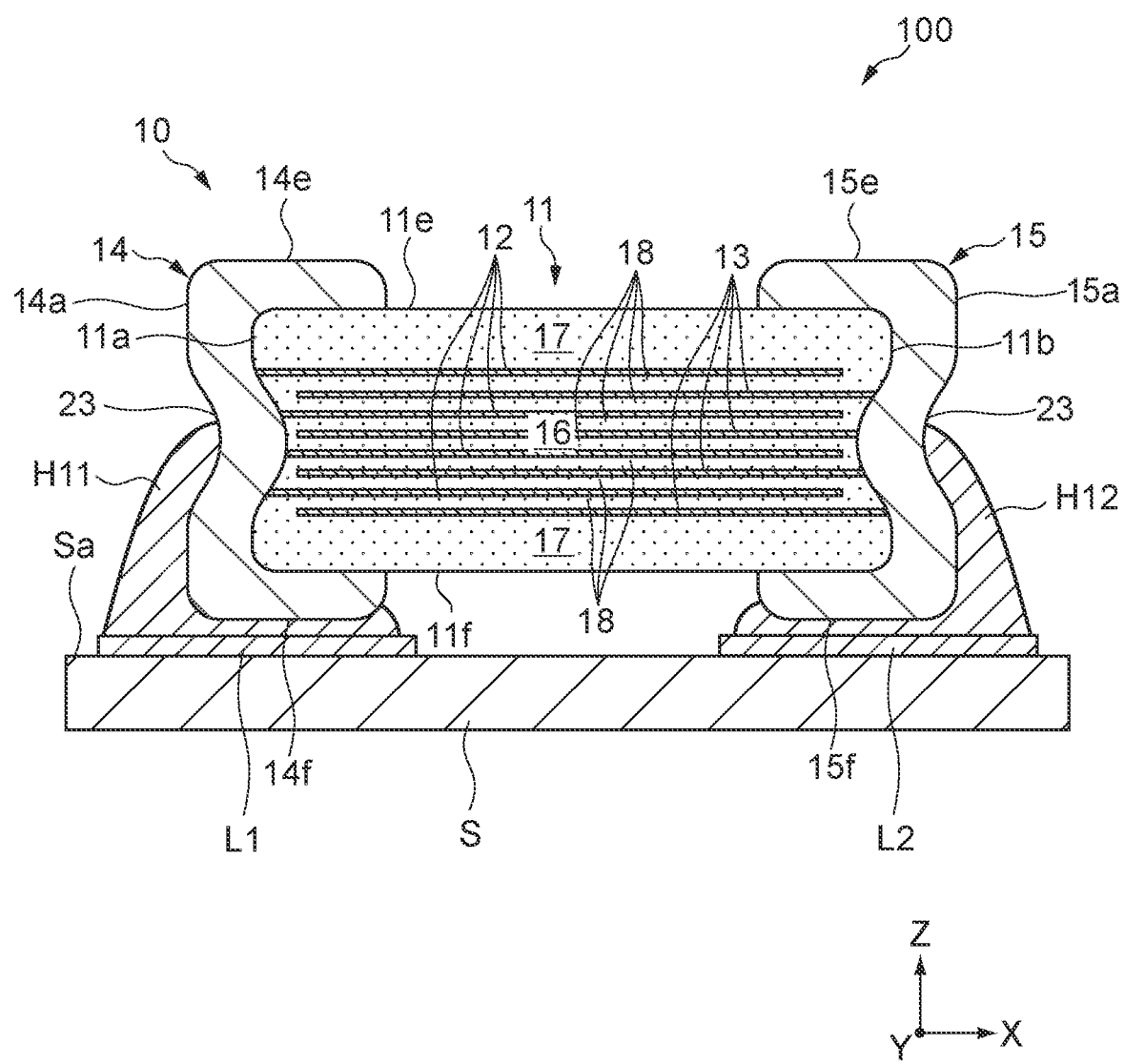
FIG. 5 is a cross-sectional view of a circuit board including the multi-layer ceramic capacitor.

FIG. 5 is a cross-sectional view of a circuit board 100 of this embodiment.

The circuit board 100 includes a mounting board S, the multi-layer ceramic capacitor 10, a first solder H11, and a second solder H12.

The mounting board S has a mounting surface Sa for mounting the multi-layer ceramic capacitor 10 and includes a circuit (not shown). The mounting surface Sa includes a first land L1 to be connected to the first external electrode 14, and a second land L2 to be connected to the second external electrode 15.

The multi-layer ceramic capacitor 10 is disposed such that the first main surface 11$e$ or the second main surface 11$f$ faces the mounting board S, and in the example shown in FIG. 5, disposed such that the second main surface 11$f$ faces the mounting board S. The second electrode main surface 14$f$ faces the first land L1. The second electrode main surface 15$f$ faces the second land L2.

The first solder H11 connects the first external electrode 14 and the mounting board S to each other and is formed on the first land L1. The second solder H12 connects the second external electrode 15 and the mounting board S to each other and is formed on the second land L2. As an example, the first solder H11 and the second solder H12 are formed from the first and second lands L1 and L2 to the first concave regions 23.

The circuit board 100 is produced as follows. First, a solder paste is applied to the first and second lands L1 and L2 of the mounting board S, and the second electrode main surfaces 14$f$ and 15$f$ are disposed on the solder paste. Thus, the first and second external electrodes 14 and 15 are in contact with the solder paste.

The mounting board S, on which the multi-layer ceramic capacitor 10 is disposed through the solder paste, is heated in this state in a reflow furnace, and the solder paste on the first and second lands L1 and L2 is heated and melted. Along with the melt of the solder paste, the multi-layer ceramic capacitor 10 sinks down toward the first and second lands L1 and L2. Thus, the molten solder on the first and second lands L1 and L2 spreads upwardly from the second electrode main surfaces 14$f$ and 15$f$ to the electrode end surfaces 14$a$ and 15$a$.

The molten solder reaches each first concave region 23 and flows into the recess of the first concave region 23. The molten solder is less likely to spread upwardly to the first peripheral region 22 located at the upper side of the first concave region 23 in the Z-axis direction, and thus accumulates in the recess. The molten solder is cooled and solidified afterward, thus forming the solders H11 and H12 that connect the first and second external electrodes 14 and 15 and the mounting board S to each other.

5. OPERATION AND EFFECT OF EMBODIMENT

Figure 6:
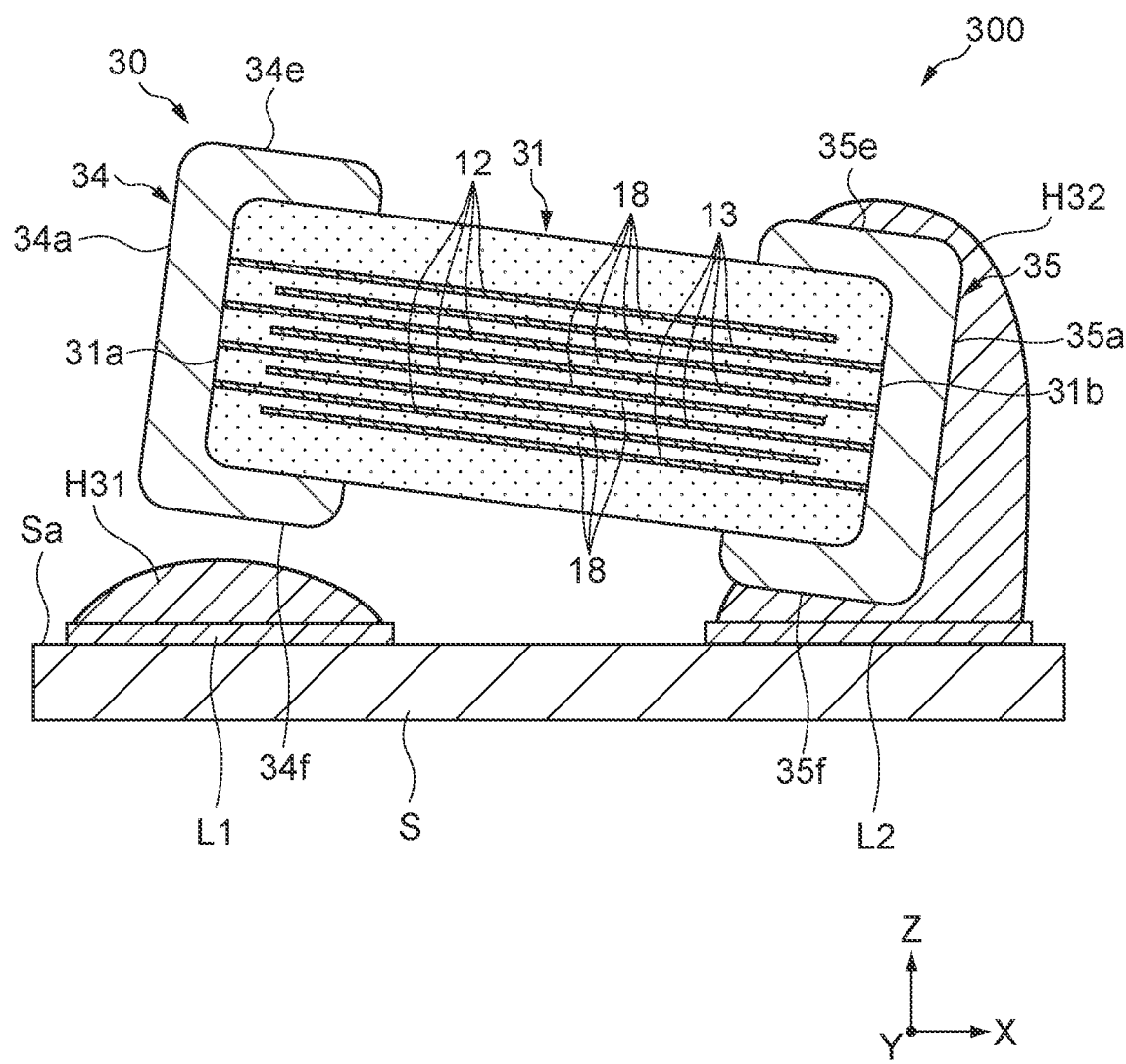
FIG. 6 is a cross-sectional view of a circuit board according to a comparative example of the embodiment.

FIG. 6 is a cross-sectional view of a circuit board 300 according to a comparative example of this embodiment. Note that in the following description the constituent elements similar to those of the circuit board 100 described above will be denoted by the same reference symbols, and description thereof will be omitted.

The circuit board 300 includes a mounting board S, a multi-layer ceramic capacitor 30, a first solder H31, and a second solder H32. The multi-layer ceramic capacitor 30 includes a ceramic body 31, a first external electrode 34, and a second external electrode 35. End surfaces 31$a$ and 31$b$ of the ceramic body 31 facing in the X-axis direction do not include the second concave regions described above, and for example, are configured to be substantially flat. Electrode end surfaces 34a and 35a of the first and second external electrodes 34 and 35 facing in the X-axis direction do not include the first concave regions described above, and for example, are configured to be substantially flat.

As described above, the first solder H31 and the second solder H32 are formed by melting the solder paste disposed on lands L1 and L2.

The molten solder spreading upwardly in the Z-axis direction on the electrode end surfaces 34a and 35a exerts a surface tension on the electrode end surfaces 34a and 35a.

When the magnitude of the surface tension is different between the first external electrode 34 and the second external electrode 35, the rotational moment about the Y-axis is added to the multi-layer ceramic capacitor 30. As a result, as shown in FIG. 6, the external electrode 34 on one side of the multi-layer ceramic capacitor 30 rises upwardly in the Z-axis direction, and a so-called Manhattan phenomenon occurs.

Further, when the multi-layer ceramic capacitor 30 is miniaturized, the weight of the multi-layer ceramic capacitor 30 is reduced, and the Manhattan phenomenon is likely to occur even with a slight imbalance of the surface tension due to the molten solder. Thus, the Manhattan phenomenon may occur by a slight difference in the amount of the solder paste disposed on the first and second lands L1 and L2 and in the area of those lands L1 and L2, and a slight deviation of the position of the multi-layer ceramic capacitor 30 on the mounting board S. Therefore, it is difficult to prevent the Manhattan phenomenon by controlling those problems.

In particular, in the case of a low-height multi-layer ceramic capacitor 30 having a small height dimension in the Z-axis direction, the molten solder easily spreads upwardly in the Z-axis direction, and may reach the first electrode main surface 34e or 35e that does not face the mounting board S as shown in FIG. 6. When the molten solder reaches one of the first electrode main surfaces 34e and 35e first, the rotational moment about the Y axis due to the surface tension of the molten solder is increased, and the Manhattan phenomenon is more likely to occur.

In this regard, in this embodiment, each of the electrode end surfaces 14a and 15a of the first and second external electrodes 14 and 15 includes the first concave region 23 recessed such that b/a is 0.004 or more and 0.025 or less.

When b/a is 0.004 or more, the first concave region 23 can be sufficiently recessed from the first peripheral region 22, and the molten solder can be accumulated in the first concave region 23 of each of the first and second external electrodes 14 and 15. This allows the accumulated molten solder to exert a downward force in the Z-axis direction on the first and second external electrodes 14 and 15 and to prevent the first and second external electrodes 14 and 15 from floating upwardly in the Z-axis direction. Therefore, the Manhattan phenomenon can be effectively prevented.

When b/a is 0.025 or less, the recess of the first concave region 23 can be moderately gentle. This allows the recess of the second concave region 21 to be similarly gentle and to prevent the vicinity of the boundary P1 or P2 between the second concave region 21 and the second peripheral region 20 from protruding. Therefore, it is possible to prevent the structural defect such as cracks from occurring in the vicinity of the boundaries P1 and P2 due to thermal or mechanical stress at the time of or after mounting. Further, it is possible to prevent the deterioration of reliability such as the deterioration of moisture resistance resulting from a structural defect of the ceramic body 11.

Further, the second peripheral region 20 is formed in a band shape having a width in the Z-axis direction, which can prevent the vicinity of the boundary P1 or P2 between the second concave region 21 and the second peripheral region 20 from sharply protruding. This also makes it possible to prevent the structural defect such as cracks in the vicinity of the boundaries P1 and P2.

In addition, the second concave region 21 is provided to each of the first and second end surfaces 11a and 11b of the ceramic body 11 and is configured to be covered with the first concave region 23 of each of the first and second external electrodes 14 and 15, which makes it possible to form the first concave region 23 having a desired shape while substantially uniformly forming the thickness of the first and second external electrodes 14 and 15. This makes it possible to provide the external electrodes 14 and 15 partially thinned and to prevent the deterioration of the environmental resistance of the multi-layer ceramic capacitor 10.

As described above, according to this embodiment, it is possible to effectively prevent the Manhattan phenomenon while preventing the structural defect of the ceramic body 11.

6. METHOD OF PRODUCING MULTI-LAYER CERAMIC CAPACITOR

Figure 7:
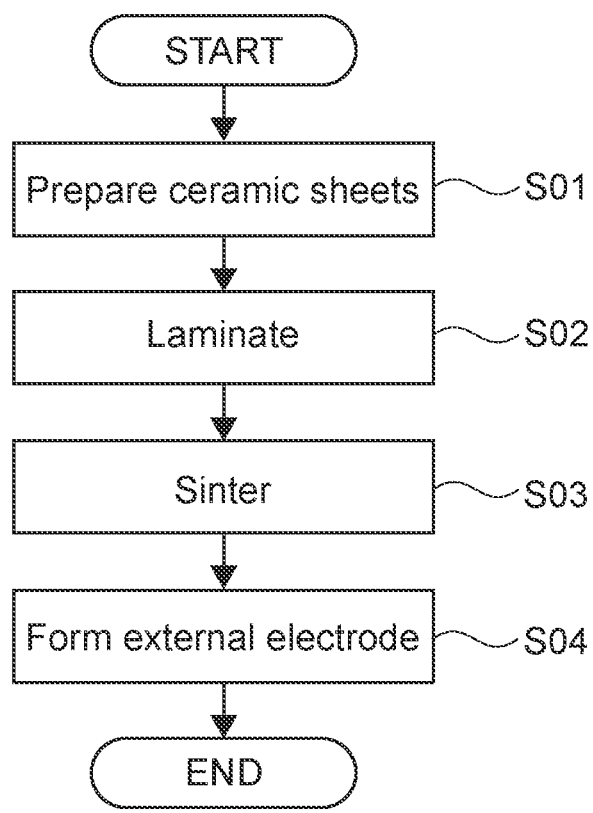
FIG. 7 is a flowchart showing a method of producing the multi-layer ceramic capacitor.
Figure 8:
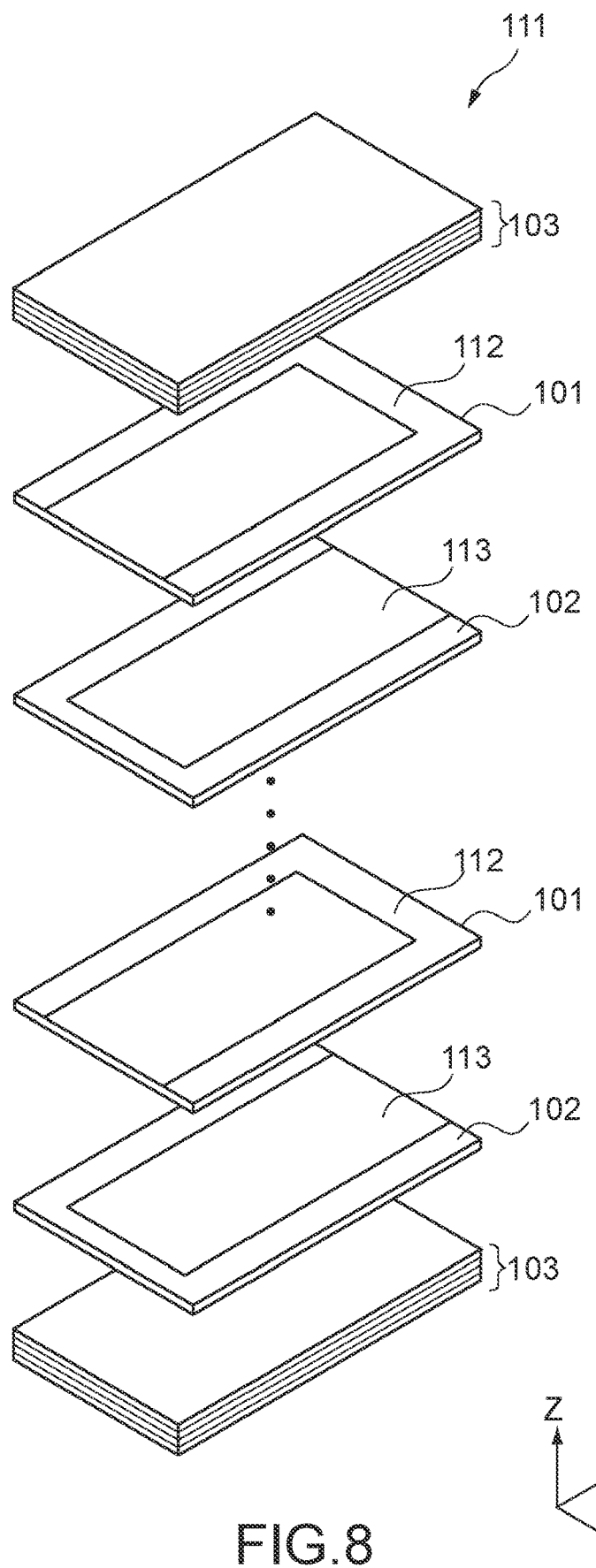
FIG. 8 is a perspective view showing a production process of the multi-layer ceramic capacitor.

FIG. 7 is a flowchart showing a method of producing the multi-layer ceramic capacitor 10. FIG. 8 is a view showing a production process of the multi-layer ceramic capacitor 10. Hereinafter, a method of producing the multi-layer ceramic capacitor 10 will be described along FIG. 7 with reference to FIG. 8 as appropriate.

6.1 Step S01: Preparation of Ceramic Sheets

Referring to FIG. 8, in Step S01, first ceramic sheets 101 for multi-layer unit and second ceramic sheets 102 for multi-layer unit for forming the multi-layer unit 16, and third ceramic sheets 103 for cover for forming the covers 17 are prepared. In this embodiment, the first ceramic sheets 101 for multi-layer unit and the second ceramic sheets 102 for multi-layer unit are "first ceramic sheets". The third ceramic sheets 103 for cover are "second ceramic sheets".

The first, second, and third ceramic sheets 101, 102, and 103 are configured as unsintered dielectric green sheets mainly containing dielectric ceramics. All of the first, second, and third ceramic sheets 101, 102, and 103 include a ceramic material as a main component, an organic binder, and a solvent.

The first, second, and third ceramic sheets 101, 102, and 103 are each formed into a sheet shape by using a roll coater or a doctor blade, for example. The thickness of the first and second ceramic sheets 101 and 102 for multi-layer unit is adjusted according to the thickness of the ceramic layer 18 in the multi-layer unit 16 after sintering. The thickness of the third ceramic sheets 103 for cover can be appropriately adjusted.

In this embodiment, the first ceramic sheets 101 for multi-layer unit and the second ceramic sheets 102 for multi-layer unit have a first density c. The third ceramic sheets 103 for cover have a second density d larger than the first density c. The first density c and the second density d satisfy the following expression (1).

$$0.050 \leq (d-c)/d \leq 0.150 \tag{1}$$

Use of this expression makes it possible to form the second concave region 21 and prevent a structural defect of the ceramic body 11 after sintering, as will be described later.

Unsintered first internal electrodes 112 corresponding to the first internal electrodes 12 are formed on the first ceramic sheets 101 for multi-layer unit, and unsintered second internal electrodes 113 corresponding to the second internal electrodes 13 are formed on the second ceramic sheets 102 for multi-layer unit. No internal electrodes are formed on the third ceramic sheets 103 for cover.

6.2 Step S02: Lamination

In Step S02, the first, second, and third ceramic sheets 101, 102, and 103 are laminated as shown in FIG. 8 to produce an unsintered ceramic body 111. Specifically, the third ceramic sheets 103 for cover are laminated in the Z-axis direction on the outer surfaces of the laminate in the Z-axis direction, the laminate including the first ceramic sheets 101 for multi-layer unit and the second ceramic sheets 102 for multi-layer unit alternately laminated. The number of first, second, and third ceramic sheets 101, 102, and 103 is not limited to the example shown in FIG. 8.

Note that the unsintered ceramic body 111 corresponding to the single ceramic body 11 has been described above, but actually, a multi-layer sheet configured as a large-sized sheet, which is not singulated, is formed and singulated into the ceramic bodies 111. The unsintered ceramic body 111 is integrated by pressure-bonding the first, second, and third ceramic sheets 101, 102, and 103.

6.3 Step S03: Sintering

In Step S03, the unsintered ceramic body 111 is sintered, thus producing the ceramic body 11 shown in FIGS. 1 to 3. A sintering temperature can be determined on the basis of a sintering temperature for the ceramic body 111. For example, if a barium titanate based material is used as dielectric ceramics, the sintering temperature can be set to approximately 1000 to 1300° C. Further, sintering can be performed in a reduction atmosphere or a low-oxygen partial pressure atmosphere, for example.

Here, in this embodiment, the second density d of the third ceramic sheets 103 for cover is larger than the first density c of the first and second ceramic sheets 101 and 102 for multi-layer unit, and the above expression (1) is satisfied. As a result, during sintering, the shrinkage amount of the first and second ceramic sheets 101 and 102 for multi-layer unit is larger than the shrinkage amount of the third ceramic sheets 103 for cover. Therefore, the surface of the laminated region of the first and second ceramic sheets 101 and 102 for multi-layer unit corresponding to the multi-layer unit 16 is recessed from the surface of the laminated region of the third ceramic sheets 103 for cover corresponding to the cover 17. Thus, the pair of second peripheral regions 20 and the second concave region 21 are formed on each of the first and second end surfaces 11a and 11b.

6.4 Step S04: Formation of External Electrodes

In Step S04, the first and second external electrodes 14 and 15 are formed in both ends in the X-axis direction of the ceramic body 11 obtained in Step S03. As an example, first, an electrically conductive paste is applied to both ends of the ceramic body 11 in the X-axis direction and is baked to form a base film. Next, the ceramic body 11 on which the base film is formed is immersed in a plating solution and subjected to electrolytic plating, to form one or more plating films.

Thus, the multi-layer ceramic capacitor 10 as shown in FIGS. 1 to 3 is formed.

In this embodiment, the second peripheral regions 20 and the second concave region 21 are formed on each of the first and second end surfaces 11a and 11b. Thus, when the first and second external electrodes 14 and 15 are formed to cover the first and second end surfaces 11a and 11b, the first concave region 23 satisfying the condition where b/a is 0.004 or more and 0.025 or less can be formed.

7. EXAMPLES

As Examples of this embodiment, samples of the multi-layer ceramic capacitor 10 (Examples 1 to 5 and Comparative examples 1 to 4) were produced according to the production method described above. Those samples had a dimension in the X-axis direction of 1.0 mm, a dimension in the Y-axis direction of 0.5 mm, and a dimension in the Z-axis direction of 0.22 mm.

The first density c and the second density d, which were respectively the density of the unsintered ceramic sheets for multi-layer unit and the density of the unsintered ceramic sheets for cover that were used for producing the samples, were measured to calculate (d−c)/d. Table 1 shows the calculated values of (d−c)/d. The first density c and the second density d were adjusted according to humidification conditions at the time of forming the green sheets.

TABLE 1

|  | (d − c)/d | Rate of occurrence of delamination |
| --- | --- | --- |
| Example 1 | 0.063 | 0/400 |
| Example 2 | 0.067 | 0/400 |
| Example 3 | 0.071 | 0/400 |
| Example 4 | 0.133 | 0/400 |
| Example 5 | 0.143 | 0/400 |
| Comparative example 1 | 0.000 | 0/400 |
| Comparative example 2 | 0.188 | 10/400 |
| Comparative example 3 | 0.200 | 7/400 |
| Comparative example 4 | 0.250 | 30/400 |

The 400 samples of each of Examples 1 to 5 and Comparative examples 1 to 4 were polished so as to expose a cross-section bisecting the sample in the Y-axis direction (a cross-section parallel to the Z-X plane), and the cross-section was observed. Thus, it was evaluated whether delamination occurred or not in the vicinity of the boundary between the multi-layer unit and the cover.

As shown in Table 1, in Comparative examples 2 to 4 in which the value of (d−c)/d was larger than 0.150, there were 7 to 30 samples in which delamination occurred in the 400 samples. It is conceivable that when the value of (d−c)/d is larger than 0.150, the difference in the shrinkage amount during sintering between the ceramic sheets for multi-layer unit and the ceramic sheets for cover is increased, a large stress is generated in the vicinity of the boundary between the multi-layer unit and the cover, and delamination occurs.

Meanwhile, in Examples 1 to 5 and Comparative example 1 in which the value of (d−c)/d was 0.150 or less, the rate of occurrence of delamination was zero. From those results, it was confirmed that the delamination caused by the difference in the shrinkage amount during sintering between the ceramic sheets for multi-layer unit and the ceramic sheets for cover can be prevented by setting the value of (d−c)/d to 0.150 or less.

Subsequently, the above-mentioned cross-sections of the samples of Examples 1 to 5 and Comparative examples 1 to 4 were observed to measure the length a of an imaginary line segment that connects the boundaries between each first peripheral region and the first concave region, and the length b of a perpendicular line, which is the longest in the X-axis direction among the perpendicular lines extending from the line segment to the first concave region. Table 2 shows the results of the measurement. Note that the values shown in Table 2 indicate the average value of the 400 samples of each of Examples and Comparative examples.

TABLE 2

| | b/a | Rate of occurrence of Manhattan phenomenon | Rate of occurrence of cracks | Pass/fail of moisture resistance test |
|---|---|---|---|---|
| Example 1 | 0.004 | 0/400 | 0/400 | OK |
| Example 2 | 0.005 | 0/400 | 0/400 | OK |
| Example 3 | 0.009 | 0/400 | 0/400 | OK |
| Example 4 | 0.016 | 0/400 | 0/400 | OK |
| Example 5 | 0.017 | 0/400 | 0/400 | OK |
| Comparative example 1 | 0.003 | 3/400 | 0/400 | OK |
| Comparative example 2 | 0.031 | 0/400 | 5/400 | NG |
| Comparative example 3 | 0.033 | 0/400 | 7/400 | NG |
| Comparative example 4 | 0.035 | 0/400 | 30/400 | NG |

As shown in Table 2, in the samples of Examples 1 to 5, the value of b/a was 0.004 or more and 0.025 or less. On the other hand, in the sample of Comparative example 1, the value of b/a was 0.003. Additionally, in the samples of Comparative examples 2 to 4, the value of b/a was 0.031 to 0.035, which were larger than 0.025.

Subsequently, the 400 samples of each of Examples 1 to 5 and Comparative examples 1 to 4 were soldered to a mounting board, and whether the Manhattan phenomenon occurred or not was evaluated. Table 2 shows the results.

As shown in Table 2, in Comparative example 1 in which the value of b/a was 0.003, the Manhattan phenomenon occurred in 3 samples. When those samples were observed actually, one of the solders spread upwardly to the main surface of the first electrode. It is conceivable that in those samples the imbalance of the surface tension between the first solder and the second solder causes the moment about the Y axis in the multi-layer ceramic capacitor, and the Manhattan phenomenon occurred.

On the other hand, in Examples 1 to 5 and Comparative examples 2 to 4 in which the value of b/a was 0.004 or more, the number of occurrence of the Manhattan phenomenon was zero, and it was confirmed that the Manhattan phenomenon was surely prevented.

When the samples of Examples 1 to 5 and Comparative examples 2 to 4 soldered to the mounting board were observed actually, the form in which the solder sufficiently accumulates in the first concave regions of the two external electrodes was observed. It is conceivable that when the value of b/a is set to 0.004 or more, the first concave region has a sufficiently recessed shape from the first peripheral region, and the solder tends to accumulate in the first concave region, thus preventing the Manhattan phenomenon.

Further, the 400 soldered samples of each of Examples 1 to 5 and Comparative examples 1 to 4 were polished so as to expose a cross-section bisecting the sample in the Y-axis direction (a cross-section parallel to the Z-X plane), and the cross-section was observed. Thus, it was evaluated whether cracks occurred or not in the ceramic body. Table 2 shows the results.

As shown in Table 2, in Comparative examples 2 to 4 in which the value of b/a was larger than 0.025, there were samples in which cracks occurred in the vicinity of the boundary between the second peripheral region and the second concave region of the ceramic body. This is because the vicinity of the protruding boundary between the second peripheral region and the second concave region is damaged by thermal or mechanical stress at the time of mounting.

In order to evaluate the structural defect of the ceramic body from a different point of view, a moisture resistance test for evaluating moisture resistance was performed on the samples of Examples 1 to 5 and Comparative examples 1 to 4 mounted on a mounting board. In the moisture resistance test, the 400 samples of each of Examples 1 to 5 and Comparative examples 1 to 4 were held for 1000 hours at a temperature of 45° C. and a humidity of 95% under application of a rated voltage of 10V. In the moisture resistance test, a sample whose electric resistance value was smaller than 10 MO was determined as a defective. When the number of defective samples of moisture resistance was zero, such a case was evaluated as "OK", and when the number of defective samples of moisture resistance was one or more, such a case was evaluated as "NG". Table 2 shows the results.

As shown in Table 2, in Examples 1 to 5 and Comparative example 1 in which the value of b/a was 0.025 or less, the results of the moisture resistance test were "OK", whereas in Comparative examples 2 to 4 in which the value of b/a was larger than 0.025, the results of the moisture resistance test were "NG". From those results, it was confirmed that, in the samples of Comparative examples 2 to 4 in which the value of b/a was larger than 0.025, a structural defect such as cracks and delamination were likely to occur as described above, and thus the moisture resistance was also likely to be lowered accordingly.

As described above, it was confirmed that setting the value of b/a in the multi-layer ceramic capacitor to 0.004 or more 0.025 or less makes it possible to effectively prevent the Manhattan phenomenon and prevent the structural defect of the ceramic body. Thus, according to this embodiment, it is possible to obtain a highly reliable multi-layer ceramic capacitor while reliably preventing a mounting failure.

Further, referring to Tables 1 and 2, when the value of (d−c)/d for the ceramic sheet is set to 0.050 or more, the value of b/a for the multi-layer ceramic capacitor can be set to 0.004 or more. This makes it possible to reliably prevent the Manhattan phenomenon at the time of mounting as described above. Additionally, when the value of (d−c)/d for the ceramic sheet is set to 0.150 or less, the value of b/a for the multi-layer ceramic capacitor can be set to 0.025 or less. This makes it possible to prevent the structural defect of the ceramic body and also obtain a highly reliable configuration.

8. OTHER EMBODIMENTS

While the embodiment of the present disclosure has been described, the present disclosure is not limited to the embodiment described above, and it should be appreciated that the present disclosure may be variously modified without departing from the gist of the present disclosure.

In the embodiment described above, the method of adjusting the density of the ceramic sheet has been described as the method of producing the multi-layer ceramic capacitor, but the present disclosure is not limited to such a method of producing the multi-layer ceramic capacitor as long as the above-mentioned configuration of the multi-layer ceramic capacitor can be obtained.

The ceramic body may be configured such that the height dimension thereof in the Z-axis direction is larger than the width dimension thereof in the Y-axis direction. In such a ceramic body, the balance is easily lost particularly at the time of mounting, and a mounting defect such as the Manhattan phenomenon is likely to occur. When the first concave region is provided to the electrode end surface of the multi-layer ceramic capacitor including such a ceramic body, the Manhattan phenomenon can be effectively prevented. Note that the height dimension of the ceramic body in the Z-axis direction means the dimension of a portion to be the largest in the Z-axis direction in the ceramic body. The width dimension of the ceramic body in the Y-axis direction means the dimension of a portion to be the largest in the Y-axis direction in the ceramic body.

Additionally, the first and second end surfaces 11a and 11b may have, for example, a substantially flat configuration without the second concave region 21.

In the embodiment described above, the multi-layer ceramic capacitor has been described as an example of a multi-layer ceramic electronic component, but the present disclosure can be applied to any other multi-layer ceramic electronic components each including a pair of external electrodes. Examples of such multi-layer ceramic electronic components include a chip varistor, a chip thermistor, and a multi-layer inductor.

What is claimed is:

1. A multi-layer ceramic electronic component, comprising:
    a ceramic body including
        a first end surface and a second end surface facing in a direction of a first axis,
        a multi-layer unit including internal electrodes and ceramic layers alternately laminated in a direction of a second axis orthogonal to the first axis and drawn from the first end surface or the second end surface, and
        a pair of covers disposed outside the multi-layer unit in the direction of the second axis;
    a first external electrode disposed to cover the first end surface; and
    a second external electrode disposed to cover the second end surface, wherein
    each of the first external electrode and the second external electrode has an electrode end surface facing in the direction of the first axis,
    each electrode end surface includes
        a pair of first peripheral regions located at peripheral edges in the direction of the second axis, and
        a first concave region located between the pair of first peripheral regions and recessed from the pair of first peripheral regions, and
    in a cross-section obtained by bisecting the multi-layer ceramic electronic component in a direction of a third axis orthogonal to the first axis and the second axis, b/a is 0.004 or more and 0.025 or less, where a is a height dimension of the first concave region in the direction of the second axis, and b is a depth dimension of the first concave region in the direction of the first axis,
    wherein each of the first end surface and the second end surface of the ceramic body includes
        a pair of second peripheral regions located at peripheral edges in the direction of the second axis, and
        a second concave region located between the pair of second peripheral regions and recessed from the pair of second peripheral regions inwardly in the direction of the first axis,
    the pair of first peripheral regions cover the pair of second peripheral regions,
    the first concave region covers the second concave region, and
    the pair of second peripheral regions are disposed on flat surfaces of the pair of covers orthogonal to the first axis.

2. The multi-layer ceramic electronic component according to claim 1, wherein
    the ceramic body is configured such that a dimension in the direction of the second axis is larger than a dimension in the direction of the third axis.

3. The multi-layer ceramic electronic component according to claim 1, wherein
    the multi-layer ceramic electronic component has a dimension in the direction of the first axis and in the direction of the third axis of 0.2 mm or more and 2.0 mm or less.

4. The multi-layer ceramic electronic component according to claim 1, wherein
    the multi-layer ceramic electronic component has a dimension in the direction of the second axis of 300 μm or less.

5. The multi-layer ceramic electronic component according to claim 1, wherein
    the pair of second peripheral regions have a width in the direction of the second axis of 4 μm or more and 70 μm or less.

6. The multi-layer ceramic electronic component according to claim 5, wherein
    the pair of second peripheral regions have a width in the direction of the second axis of 6 μm or more and 55 μm or less.

7. The multi-layer ceramic electronic component according to claim 6, wherein
    the pair of second peripheral regions have a width in the direction of the second axis of 11 μm or more and 35 μm or less.

8. A method of producing a multi-layer ceramic electronic component, comprising:
    producing a ceramic body including
        a first end surface and a second end surface facing in a direction of a first axis,
        a multi-layer unit including internal electrodes and ceramic layers alternately laminated in a direction of a second axis orthogonal to the first axis and drawn from the first end surface or the second end surface; and
        a pair of covers disposed outside the multi-layer unit in the direction of the second axis; and
    forming a first external electrode disposed to cover the first end surface, and a second external electrode disposed to cover the second end surface, wherein
    each of the first external electrode and the second external electrode has an electrode end surface facing in the direction of the first axis,
    the electrode end surface includes
        a pair of first peripheral regions located at peripheral edges in the direction of the second axis, and
        a first concave region located between the pair of first peripheral regions and recessed from the pair of first peripheral regions, and
    in a cross-section obtained by bisecting the multi-layer ceramic electronic component in a direction of a third axis orthogonal to the first axis and the second axis, b/a is 0.004 or more and 0.025 or less, where a is a length of an imaginary line segment connecting boundaries between each of the pair of first peripheral regions and the first concave region, and b is a length of a longest perpendicular line in the direction of the first axis among perpendicular lines extending from the line segment to the first concave region, wherein each of the first end surface and the second end surface of the ceramic body includes
- a pair of second peripheral regions located at peripheral edges in the direction of the second axis, and
- a second concave region located between the pair of second peripheral regions and recessed from the pair of second peripheral regions inwardly in the direction of the first axis, the pair of first peripheral regions cover the pair of second peripheral regions, the first concave region covers the second concave region, and the pair of second peripheral regions are disposed on flat surfaces of the pair of covers orthogonal to the first axis.

9. The method of producing a multi-layer ceramic electronic component according to claim 8, wherein the producing the ceramic body includes
preparing first ceramic sheets having a first density and second ceramic sheets having a second density larger than the first density, the first ceramic sheets and the second ceramic sheets including unsintered internal electrodes, laminating the second ceramic sheets outside a laminate in the direction of the second axis, the laminate including the first ceramic sheets laminated in the direction of the second axis, and sintering a laminate including the first ceramic sheets and the second ceramic sheets, and an expression of $0.050 \leq (d-c)/d \leq 0.150$ is satisfied, where c is the first density and d is the second density.

10. A circuit board, comprising:

a mounting board;

a multi-layer ceramic electronic component including
a ceramic body including
- a first end surface and a second end surface facing in a direction of a first axis,
- a first main surface and a second main surface facing in a direction of a second axis orthogonal to the first axis,
- a multi-layer multi-laver unit including internal electrodes and ceramic layers alternately laminated in the direction of the second axis and drawn from the first end surface or the second end surface, and
- a pair of covers disposed outside the multi-layer unit in the direction of the second axis, a first external electrode disposed to cover the first end surface, and a second external electrode disposed to cover the second end surface, the multi-layer ceramic electronic component being disposed such that the first main surface or the second main surface faces the mounting board;

a first solder that connects the first external electrode and the mounting board to each other; and a second solder that connects the second external electrode and the mounting board to each other, wherein each of the first external electrode and the second external electrode has an electrode end surface facing in the direction of the first axis, each electrode end surface includes
- a pair of first peripheral regions located at peripheral edges in the direction of the second axis, and
- a first concave region located between the pair of first peripheral regions and recessed from the pair of first peripheral regions, and in a cross-section obtained by bisecting the multi-layer ceramic electronic component in a direction of a third axis orthogonal to the first axis and the second axis, b/a is 0.004 or more and 0.025 or less, where a is a height dimension of the first concave region in the direction of the second axis, and b is a depth dimension of the first concave region in the direction of the first axis, wherein each of the first end surface and the second end surface of the ceramic body includes
- a pair of second peripheral regions located at peripheral edges in the direction of the second axis, and
- a second concave region located between the pair of second peripheral regions and recessed from the pair of second peripheral regions inwardly in the direction of the first axis, the pair of first peripheral regions cover the pair of second peripheral regions, the first concave region covers the second concave region, and the pair of second peripheral regions are disposed on flat surfaces of the pair of covers orthogonal to the first axis.

* * * * *